United States Patent
Koo et al.

(10) Patent No.: US 10,446,371 B2
(45) Date of Patent: *Oct. 15, 2019

(54) BORON IMPLANTING USING A CO-GAS

(71) Applicant: Varian Semiconductor Equipment Associates, Inc., Gloucester, MA (US)

(72) Inventors: Bon-Woong Koo, Andover, MA (US); Vikram M. Bhosle, North Reading, MA (US); John A. Frontiero, Rockport, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/859,844

(22) Filed: Jan. 2, 2018

(65) Prior Publication Data

US 2018/0122618 A1  May 3, 2018

Related U.S. Application Data

(63) Continuation of application No. 14/692,159, filed on Apr. 21, 2015, now Pat. No. 9,887,067.

(Continued)

(51) Int. Cl.
*C23C 18/48* (2006.01)
*H01J 37/317* (2006.01)
(Continued)

(52) U.S. Cl.
CPC .......... *H01J 37/3171* (2013.01); *C23C 14/48* (2013.01); *C23C 16/513* (2013.01);
(Continued)

(58) Field of Classification Search
CPC ....... C23C 14/48; C23C 18/14; C23C 16/486; C23C 16/513; H01J 37/08; H01J 37/20;
(Continued)

(56) References Cited

U.S. PATENT DOCUMENTS 5,977,552 A    11/1999  Foad
6,221,169 B1    4/2001  Bernstein et al.
(Continued)

FOREIGN PATENT DOCUMENTS

WO    2012/037007 A2    3/2012

OTHER PUBLICATIONS

Office action dated Nov. 1, 2018 in co-pending U.S. Appl. No. 15/809,252.

(Continued)

*Primary Examiner* — Marianne L Padgett
(74) *Attorney, Agent, or Firm* — Nields, Lemack & Frame, LLC (57) ABSTRACT

An apparatus and methods of improving the ion beam quality of a halogen-based source gas are disclosed. Unexpectedly, the introduction of a noble gas, such as argon or neon, to an ion source chamber may increase the percentage of desirable ion species, while decreasing the amount of contaminants and halogen-containing ions. This is especially beneficial in non-mass analyzed implanters, where all ions are implanted into the workpiece. In one embodiment, a first source gas, comprising a processing species and a halogen is introduced into a ion source chamber, a second source gas comprising a hydride, and a third source gas comprising a noble gas are also introduced. The combination of these three source gases produces an ion beam having a higher percentage of pure processing species ions than would occur if the third source gas were not used.

11 Claims, 9 Drawing Sheets

Related U.S. Application Data (60) Provisional application No. 62/087,071, filed on Dec. 3, 2014.

(51) Int. Cl.
   *H01J 37/08* (2006.01)
   *C23C 16/513* (2006.01)
   *C23C 14/48* (2006.01)

(52) U.S. Cl.
   CPC ......... *H01J 37/08* (2013.01); *H01J 2237/006* (2013.01); *H01J 2237/0822* (2013.01)

(58) Field of Classification Search
   CPC .. H01J 37/317; H01J 37/3171; H01J 37/3172; H01J 37/3178; H01J 2237/006; H01J 2237/0212; H01J 2237/04; H01J 2237/08; H01J 2237/0822; H01J 2237/0825; H01J 2237/0827; H01J 2237/083; H01J 2237/316; H01J 2237/3165; H01J 2237/30701; H01J 2237/31705
   USPC ................. 427/523–531, 562–564; 438/308, 438/369–378, 422, 440, 473–475, 480, 438/513–534, 766, 798
   See application file for complete search history.

(56) References Cited

U.S. PATENT DOCUMENTS

| | | | |
|---|---|---|---|
| 6,756,600 B2 | 6/2004 | Ng et al. | |
| 7,655,931 B2 | 2/2010 | Gupta | |
| 9,064,795 B2 | 6/2015 | Koo et al. | |
| 9,093,372 B2 | 7/2015 | Koo et al. | |
| 9,524,849 B2* | 12/2016 | Graff | H01J 37/3171 |
| 9,677,171 B2 | 6/2017 | Koo et al. | |
| 9,831,063 B2* | 11/2017 | Byl | H01J 37/08 |
| 9,840,772 B2* | 12/2017 | Koo | C23C 14/48 |
| 9,865,430 B2 | 1/2018 | Koo et al. | |
| 9,887,067 B2 | 2/2018 | Koo et al. | |
| 10,290,466 B2* | 5/2019 | Koo | H01J 37/3171 |
| 2002/0000523 A1 | 1/2002 | Ng et al. | |
| 2008/0237496 A1 | 10/2008 | Gupta | |
| 2008/0248636 A1 | 10/2008 | Olander et al. | |
| 2009/0068082 A1 | 3/2009 | Mills | |
| 2010/0140077 A1 | 6/2010 | Koo et al. | |
| 2011/0159671 A1 | 6/2011 | Kaim et al. | |
| 2011/0309049 A1 | 12/2011 | Papasouliotis et al. | |
| 2013/0260543 A1 | 10/2013 | Koo et al. | |
| 2013/0260544 A1 | 10/2013 | Koo et al. | |
| 2014/0061501 A1 | 3/2014 | Sinha et al. | |
| 2014/0322903 A1 | 10/2014 | Mayer et al. | |
| 2015/0024579 A1 | 1/2015 | Graff et al. | |
| 2015/0354056 A1 | 12/2015 | Koo et al. | |
| 2016/0163509 A1 | 6/2016 | Koo et al. | |
| 2016/0163510 A1 | 6/2016 | Koo et al. | |
| 2016/0211137 A1 | 7/2016 | Tang et al. | |
| 2017/0247791 A1 | 8/2017 | Koo et al. | |
| 2018/0068830 A1 | 3/2018 | Koo et al. | |

OTHER PUBLICATIONS

U.S. Appl. No. 14/692,159.
International Search Report and Written Opinion dated Mar. 13, 2017 in corresponding PCT application No. PCT/US2016/025996.
Notice of Allowance dated Feb. 13, 2019 in co-pending U.S. Appl. No. 15/809,252.

\* cited by examiner

BORON IMPLANTING USING A CO-GAS

This application is a continuation of U.S. patent application Ser. No. 14/692,159 filed Apr. 21, 2015, which claims priority of U.S. Provisional Patent Application Ser. No. 62/087,071, filed Dec. 3, 2014, the disclosures of which are incorporated by reference in its entirety.

FIELD

Embodiments relate to an apparatus and methods for improving ion beam quality in an ion implantation system, and more particularly, improving boron ion beam quality by using a co-gas.

BACKGROUND

Semiconductor workpieces are often implanted with dopant species to create a desired conductivity. For example, solar cells may be implanted with a dopant species to create an emitter region. This implant may be done using a variety of different mechanisms. In one embodiment, an ion source is used.

In an effort to improve process efficiency and lower cost, in some embodiments, the ions extracted from the ion source are accelerated directly toward the workpiece, without any mass analysis. In other words, the ions that are generated in the ion source are accelerated and implanted directly into the workpiece. A mass analyzer is used to remove undesired species from the ion beam. Removal of the mass analyzer implies that all ions extracted from the ion source will be implanted in the workpiece. Consequently, undesired ions, which may also be generated within the ion source, are then implanted in the workpiece.

This phenomenon may be most pronounced when the source gas is a halogen-based compound, such as a fluoride. Fluorine ions and neutrals (metastable or excited) may react with the inner surfaces of the ion source, releasing unwanted ions, such as silicon, oxygen, carbon, and aluminum and heavy metals present as impurity elements. Additionally, halogen ions may also be implanted into the workpiece.

Therefore, an apparatus and a method which improves beam quality, particular for embodiments in which halogen based source gasses are employed, would be beneficial.

SUMMARY

An apparatus and methods of improving the ion beam quality of a halogen-based source gas are disclosed. Unexpectedly, the introduction of a noble gas, such as argon or neon, to an ion source chamber may increase the percentage of desirable ion species, while decreasing the amount of contaminants and halogen-containing ions. This is especially beneficial in non-mass analyzed implanters, where all ions are implanted into the workpiece. In one embodiment, a first source gas, comprising a processing species and a halogen is introduced into a ion source chamber, a second source gas comprising a hydride, and a third source gas comprising a noble gas are also introduced. The combination of these three source gases may produce an ion beam having a higher percentage of pure processing species ions than would occur if the third source gas were not used.

In one embodiment, a method of implanting a workpiece is disclosed. The method comprises energizing a first source gas, comprising a processing species and fluorine, and neon in a chamber to form a plasma in the chamber; and extracting ions from the plasma and directing the ions toward the workpiece, wherein an amount of pure processing species ions extracted from the plasma as a percentage of all processing species-containing ions increases by at least 5%, as compared to a baseline when neon is not used. In certain embodiments, an amount of pure processing species ions extracted from the plasma as a percentage of all processing species-containing ions increases by at least 10%, as compared to the baseline. In certain embodiments, a ratio of fluorine ions to processing species ions extracted from the plasma is decreased by at least 5%, as compared to the baseline. In certain embodiments, a beam current of pure processing species ions increases by at least 10%, as compared to the baseline.

In another embodiment, a method of implanting dopant into a workpiece is disclosed. The method comprises energizing a first source gas, comprising dopant and fluorine, a second source gas, comprising hydrogen and at least one of germanium and silicon, and neon in a chamber to form a plasma in the chamber; and accelerating ions from the plasma toward the workpiece, without using mass analysis, wherein between 20% and 90% of a total volume of gas introduced comprises neon and wherein a composition of the ions extracted from the plasma is affected by an introduction of neon. In certain embodiments, between 25% and 50% of the total volume of gas introduced comprises neon. In certain embodiments, the dopant comprises boron.

In another embodiment, an apparatus for processing a workpiece is disclosed. The apparatus comprises an ion source, having a chamber defined by chamber walls, wherein the ion source generates a plasma in the chamber; a first source gas container, containing a processing species and fluorine, in communication with the chamber; a second source gas container, containing hydrogen and at least one of silicon and germanium, in communication with the chamber; a third source gas container, containing neon, in communication with the chamber; and a workpiece support to hold the workpiece, wherein the apparatus is configured to introduce neon into the chamber in an amount sufficient to increase an amount of pure processing species ions extracted from the plasma as a percentage of all processing species-containing ions by at least 5%, as compared to a baseline when neon is not used. In certain embodiments, the dopant comprises boron. In certain embodiments, ions from the plasma are directed toward the workpiece without being mass analyzed. In certain embodiments, between 20-90% of a total amount of gas introduced to the chamber comprises neon. In certain embodiments, neon is introduced in an amount sufficient to increase a beam current of pure processing species ions by at least 10% relative to the baseline.

BRIEF DESCRIPTION OF THE FIGURES

For a better understanding of the present disclosure, reference is made to the accompanying drawings, which are incorporated herein by reference and in which.

DETAILED DESCRIPTION

As described above, ionization of halogen-based species, such as fluorides, may cause particles released from the inner surfaces of the ion source to be implanted in the workpiece. These contaminants may include aluminum, carbon, oxygen, silicon, fluorine-based compounds, and other unwanted species (including heavy metals present as impurity elements). One approach to address the damage caused by free halogen ions may be to introduce additional source gasses.

Figure 1A:
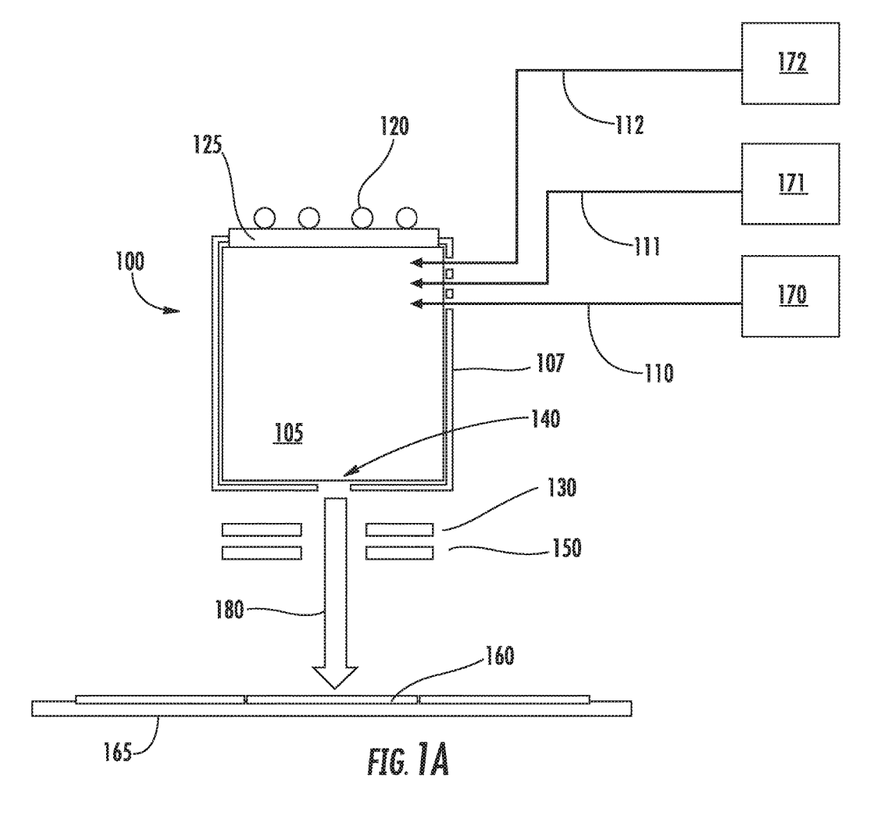
FIGS. 1A-C show workpiece processing systems according to different embodiments.
Figure 1B:
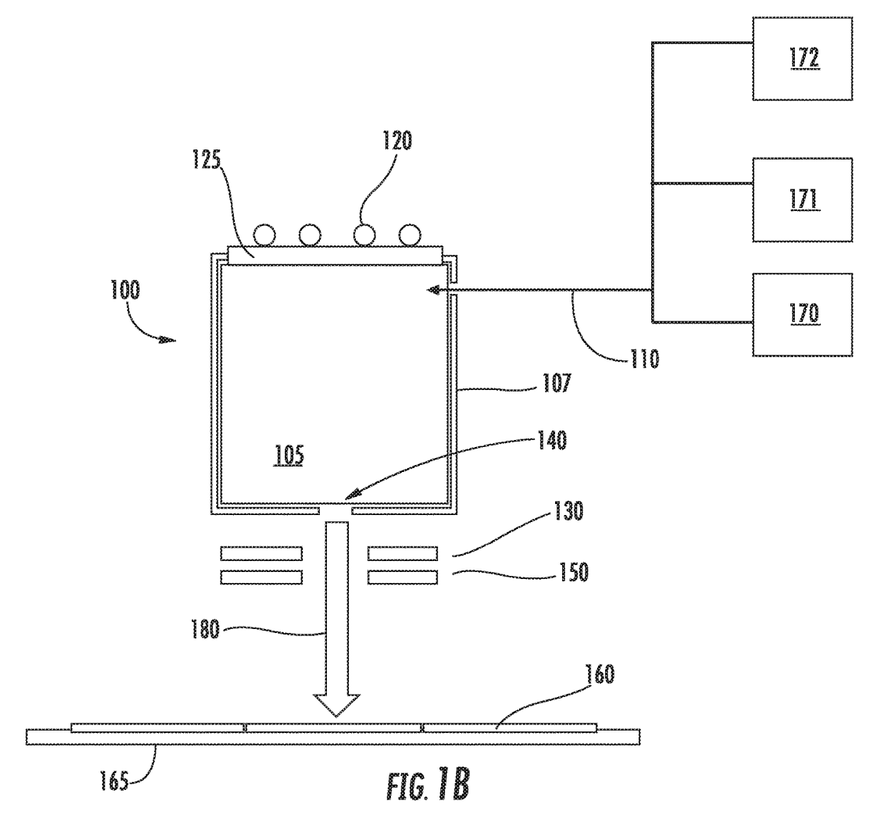
Figure 1C:
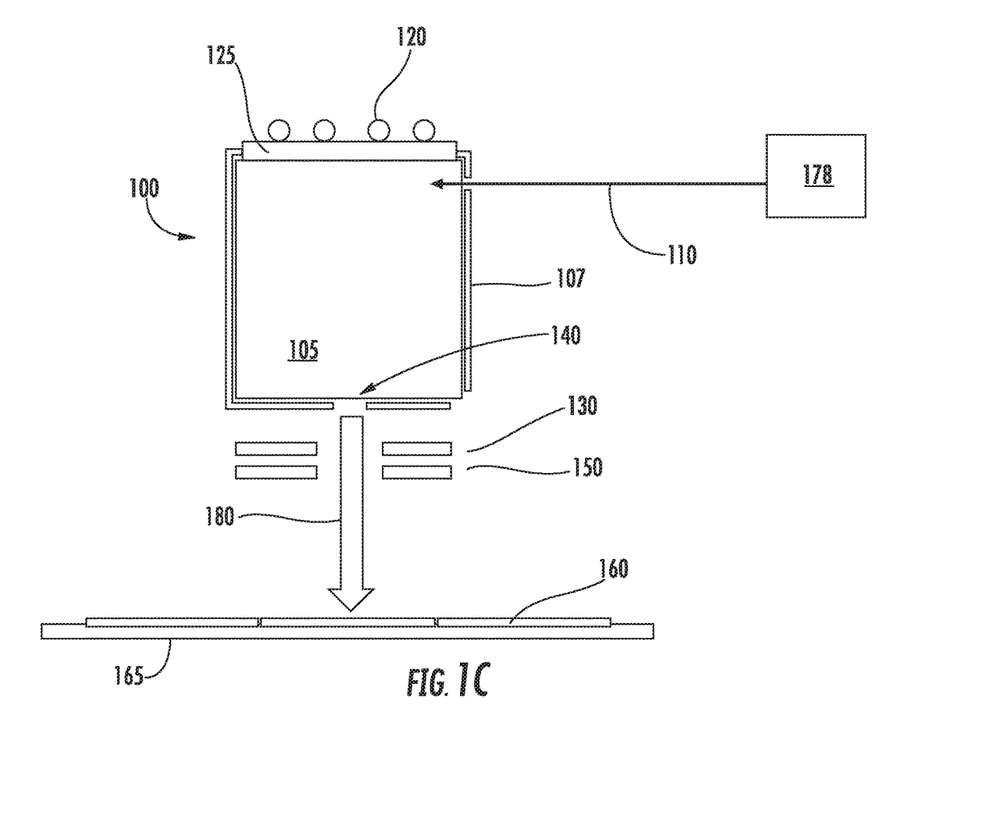

FIGS. 1A-1C show various embodiments of a workpiece processing system in which multiple source gasses may be introduced to an ion source. In each of these figures, there is an ion source 100. This ion source 100 includes a chamber 105 defined by plasma chamber walls 107, which may be constructed from graphite or another suitable material. This chamber 105 may be supplied with one or more source gasses, stored in one or more source gas containers, such as a first source gas container 170, via a gas inlet 110. This source gas may be energized by an RF antenna 120 or another plasma generation mechanism to generate a plasma. The RF antenna 120 is in electrical communication with a RF power supply (not shown) which supplies power to the RF antenna 120. A dielectric window 125, such as a quartz or alumina window, may be disposed between the RF antenna 120 and the interior of the chamber 105. The chamber 105 also includes an aperture 140 through which ions may pass. A negative voltage is applied to extraction suppression electrode 130 disposed outside the aperture 140 to extract the positively charged ions in the form of an ion beam 180 from the plasma in the chamber 105 through the aperture 140 and toward the workpiece 160, which may be disposed on a workpiece support 165. A ground electrode 150 may also be employed. In some embodiments, the aperture 140 is located on the side of the chamber 105 opposite the side containing the dielectric window 125. As shown in FIG. 1A, a second source gas may be stored in a second source gas container 171 and introduced to the chamber 105 through a second gas inlet 111. A third source gas may be stored in a third source gas container 172 and introduced to the chamber 105 through a third gas inlet 112. In another embodiment, shown in FIG. 1B, a second source gas may be stored in a second source gas container 171 and a third source gas may be stored in a third source gas container 172. The second source gas and the third source gas may both be introduced to the chamber 105 through the same gas inlet 110 used by the first source gas. In yet another embodiment, shown in FIG. 1C, the second source gas and the third source gas may be mixed with the first source gas in a single gas container 178. This mixture of gasses is then introduced to the chamber 105 through gas inlet 110.

In any of these embodiments, the first source gas, the second source gas and the third source gas may be introduced simultaneously or sequentially to the chamber 105. While these figures show the use of three different source gasses, the disclosure is not limited to any particular number. These figures intend to show various embodiments where multiple source gasses may be introduced to a chamber 105. However, other embodiments are also possible and within the scope of the disclosure.

Figure 5:
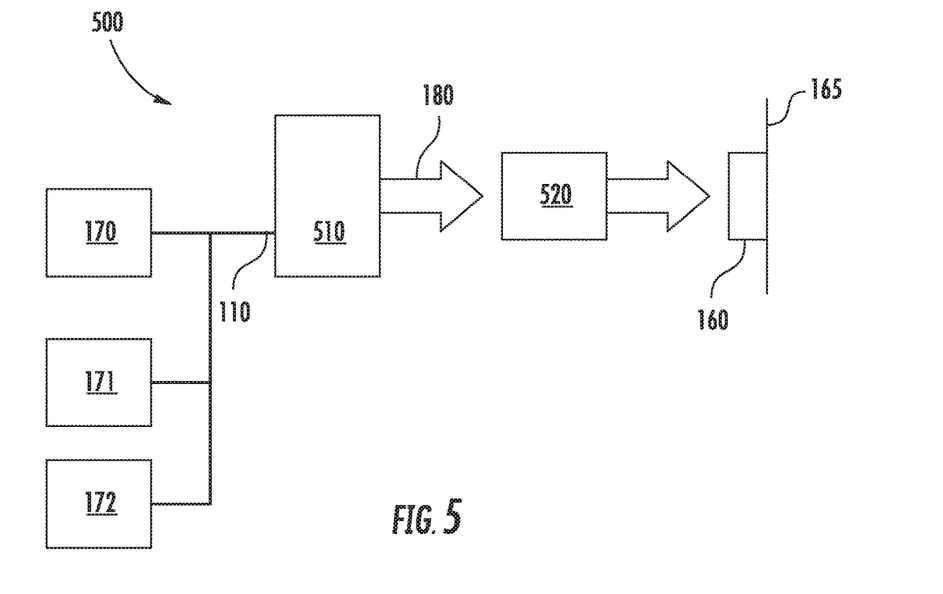
FIG. 5 is another embodiment of a workpiece processing system.

FIGS. 1A-1C shows embodiments of a workpiece processing system. However, the disclosure is not limited to these embodiments. For example, FIG. 5 shows another embodiment of a workpiece processing system, which may be a beam line implanter 500. The beam line implanter 500 comprises an ion source 510, where source gasses are introduced. The ion source 510 may comprise a chamber having an aperture through which ions may be extracted. The first source gas may be stored in first source gas container 170, the second source gas may be stored in second source gas container 171 and the third source gas may be stored in third source gas container 172. These sources gasses may be introduced to the ion source 510 through gas inlet 110. Of course, these source gasses may be introduced in other ways, such as those shown in FIGS. 1A and 1C.

The ion source 510 generates ions by energizing the source gasses into a plasma. In certain embodiments, an indirectly heated cathode (IHC) may be used, although other mechanisms may be used to generate the plasma. Ions from the plasma are then accelerated through an aperture in the ion source 510 as an ion beam 180. This ion beam 180 is then directed toward a set of beam line components 520, which manipulate the ion beam 180. For example, the beam line components 520 may accelerate, decelerate or redirect the ions from the ion beam 180. In certain embodiments, the beam line components 520 may include a mass analyzer. The mass analyzer may be used to remove unwanted species from the ion beam 180 before they impact the workpiece 160. The workpiece 160 may be disposed on a workpiece support 165.

Figure 6:
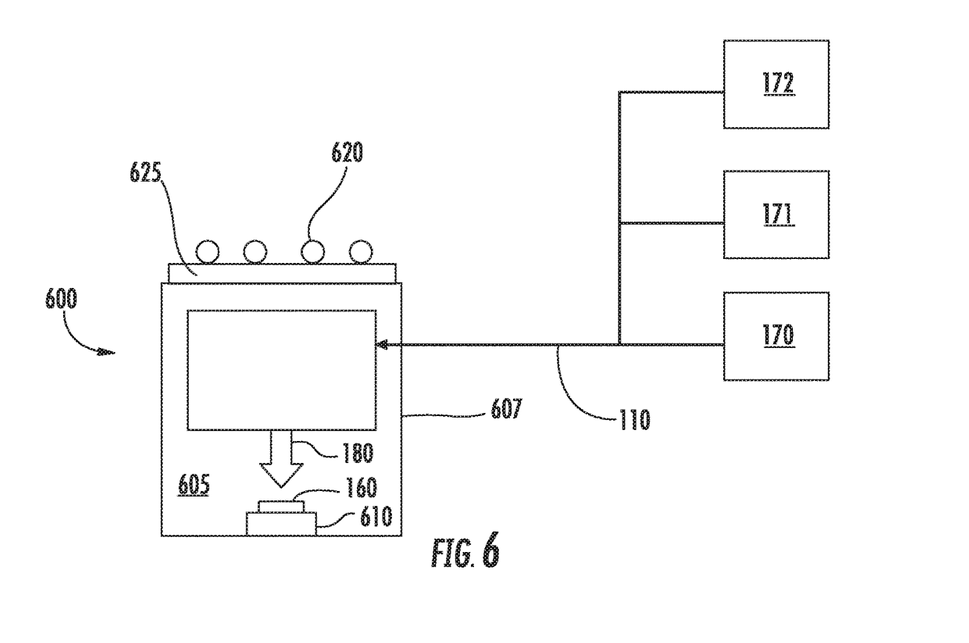
FIG. 6 is another embodiment of a workpiece processing system.

FIG. 6 shows another workpiece processing apparatus that may be used with the present disclosure. This workpiece processing apparatus 600 includes a chamber 605 defined by plasma chamber walls 607. Like FIG. 1B, the chamber 605 may be in communication with a first source gas container 170, a second source gas container 171 and a third source gas container 172 via gas inlet 110. However, in other embodiments, the source gasses may be configured as shown in FIG. 1A or 1C. Further, like FIG. 1B, the apparatus may include a dielectric window 625 having an RF antenna 620 disposed thereon. Like FIG. 1B, the RF antenna is used to generate a plasma within the chamber 605. Of course, other plasma generators may also be used. In this workpiece processing apparatus 600, the workpiece 160 is disposed within the chamber 605. A platen 610 is used to hold the workpiece 160. In certain embodiments, the platen 610 may be biased to accelerate ions from the plasma toward the workpiece 160 in the form of an ion beam 180.

The first source gas, also referred to as the feed gas, may comprise a dopant, such as boron, in combination with fluorine. Thus, the feed gas may be in the form of $DF_n$ or $D_mF_n$, where D represents the dopant atom, which may be boron, gallium, phosphorus, arsenic or another Group 3 or Group 5 element. In other embodiments, the first source gas may comprise a processing species in combination with fluorine. Thus, although the term "dopant" is used throughout this disclosure, it is understood that there are other processing species that may be used which may not be dopants. Thus, the first source gas comprises a processing species and fluorine. In certain embodiments, the processing species is a dopant.

The second source gas may be a molecule having a chemical formula of $XH_n$ or $X_mH_n$, where H is hydrogen. X may be a dopant species, such as any of those described above. Alternatively, X may also be an atom that does not affect conductivity of the workpiece 160. For example, if the workpiece 160 comprises silicon, X may be a Group 4 element, such as silicon and germanium. The third source gas may be a noble gas, such as helium, argon, neon, krypton and xenon.

In other words, the first source gas may be $BF_3$ or $B_2F_4$, while the second source gas may be, for example, $PH_3$, $SiH_4$, $NH_3$, $GeH_4$, $B_2H_6$, or $AsH_3$. The third source gas may be a noble gas, such as helium, argon, neon, krypton or xenon, in each of these embodiments. This list represents possible species that may be used. It is understood that other species are also possible.

By combining the first source gas with the second source gas, the deleterious effects of the fluorine ions may be reduced. For example, without being limited to any particular theory, the introduction of hydrogen may create a film or coating on the dielectric window 125. This serves to protect the dielectric window 125, which reduces the amount of contaminants originating from the dielectric window 125 that are contained in the extracted ion beam 180. In addition, the second source gas may coat the inner surfaces of the plasma chamber walls 107, which may be another source of contaminants. This coating may reduce the interaction between fluorine ions and the inner surfaces of the plasma chamber walls 107, reducing the amount of contaminants generated.

The introduction of the second source gas may reduce the creation of contaminants and the incorporation of these contaminants in the ion beam 180. However, in some embodiments, the resulting ion beam produced using the first source gas and the second source gas may not contain a sufficient quantity of the desired ions.

Figure 2A:
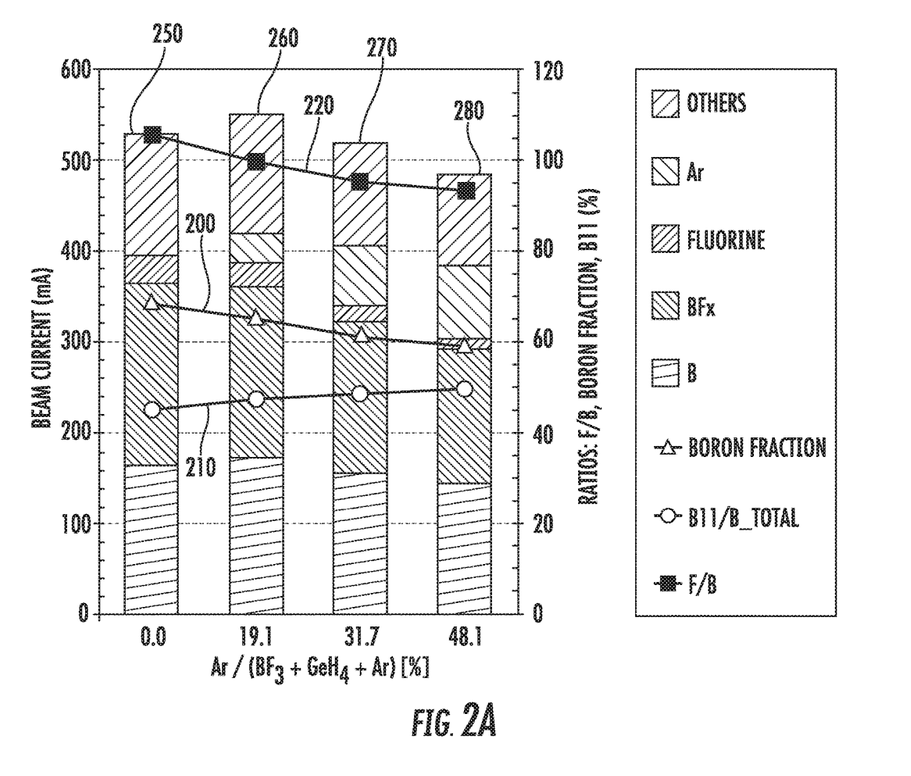
FIG. 2A is a representative graph of ion beam current as a function of argon gas concentration.

FIG. 2A shows a plurality of bar graphs which show the ion species produced by an ion source using $BF_3$ as the first source gas and $GeH_4$ as the second source gas, with a varying amount of argon, which serves as the third source gas in this embodiment. In each of these bar graphs, the RF power was 8 kW, and the combined flow rate of the $BF_3$ and $GeH_4$ was 18 sccm. Additionally, the ratio of $BF_3$ to $GeH_4$ was held constant at 9:1.

In each of the bar graphs, it can be seen that the ion source 100 ionizes the $BF_3$ to form boron ions (i.e. $B^+$), as well as $BF_x^+$ ions, where $BF_x$ includes BF, $BF_2$ and $BF_3$. Additionally, fluorine ions are created. Finally, a plurality of other ion species, which may be components of the second source gas or may be impurities, is also created.

As described above, the introduction of the second source gas may reduce the amount of contaminants introduced in the ion beam. As stated above, this may be significant when the ion beam is used to implant the workpiece without mass analysis.

Bar graph 250 shows the composition of an ion beam where no argon is introduced, also referred to as the baseline. As seen in line 200, in this configuration, nearly 69% of the ions in the ion beam are dopant-containing ions, where, in this example, the dopant is boron. This metric is referred to as the boron fraction, or the dopant fraction. However, many of the dopant-containing ions also contain fluoride, such as in the form of $BF^+$, $BF_2^+$ and $BF_3^+$. In fact, as shown in line 210, only about 45% of the dopant-containing ions are pure dopant (i.e. $B^+$). This ratio is referred to as the boron purity percentage, or the dopant purity percentage. In other embodiments, this ratio may be referred to as the processing species purity percentage. Lastly, while 69% of the ion beam contains boron, a very large percentage of the ions also contain fluorine. In fact, line 220 shows the ratio of fluorine ions extracted as part of the ion beam 180 to dopant ions. The fluorine ions used in this ratio are a measure of all of the fluorine ions that are extracted. In other words, this includes pure fluorine ions ($F_x^+$), as well as ions that include other species, such as $BF_x^+$. Each fluorine ion is individually counted; thus, for example, $BF_2^+$ is counted as two fluorine ions. The number of dopant ions is calculated in the same way. Line 220 shows that there are actually more fluorine ions than boron ions. This metric is referred to as the F/B ratio.

Bar graph 260 shows the composition of an ion beam where approximately 19% of the total gas introduced to the ion chamber is the third source gas, which may be argon in this embodiment. Note that the total beam current of dopant-containing ions (i.e. $B^+$ and $BF_x^+$) remains almost unchanged at about 360 mA. However, there is a change in the composition of the ion beam. Specifically, as seen on line 200, the boron fraction has decreased slightly, mostly due to the additional argon ions that have been created. However, surprisingly, as shown in line 210, the percentage of pure dopant ions as compared to the total number of dopant-containing ions (the boron purity percentage or dopant purity percentage) has actually increased! In fact, the beam current of pure boron ions has also increased. Additionally, the ratio of fluorine ions to boron ions extracted as part of the ion beam (i.e. the F/B ratio), as shown in line 220, has also decreased unexpectedly to about 100%. Additionally, the beam current of fluoride ions has decreased as well. In other words, the introduction of argon as a third source gas affected the composition of the resulting ion beam. Specifically, the introduction of argon has increased the formation of pure boron ions relative to the total number of boron-containing ions. Interestingly, the introduction of argon has also decreased the ratio of fluorine ions to boron ions. As stated above, in embodiments where mass analysis is not performed, these changes may improve the performance of the implanted workpiece.

Many of these trends continue as a greater percentage of argon is introduced. Bar graph 270 shows the composition of the ion beam where about 32% of all gas introduced into the chamber 105 comprises argon. At this concentration, the beam current of boron-containing ions begins to decrease slightly, from 360 mA to about 320 mA. The boron fraction has also decreased slightly due to the increased number of argon ions. However, other metrics have improved. Specifically, the boron purity percentage actually increased to nearly 50%. Additionally, the F/B ratio decreased to about 95%. Interestingly, the amount of other species, which includes all ions that are not boron-containing ions, fluorine ions or argon ions, actually decreases at this argon percentage. The beam current of fluorine ions also decreases to less than about 20 mA.

Bar graph 280 shows the composition of the ion beam where about 48% of all gas introduced into the chamber 105 comprises argon. At this concentration, the beam current of boron-containing ions again decreases slightly, from 320 mA to about 290 mA. The boron fraction has also decreased slightly to about 60% due to the increased number of argon ions. However, other metrics have continued to improve. Specifically, the boron purity percentage actually increased to about 50%. Additionally, the F/B ratio decreased to about 90%. Again, the beam current of the other species has decreased as well. The beam current of fluorine ions also decreases to about 10 mA.

Figure 2B:
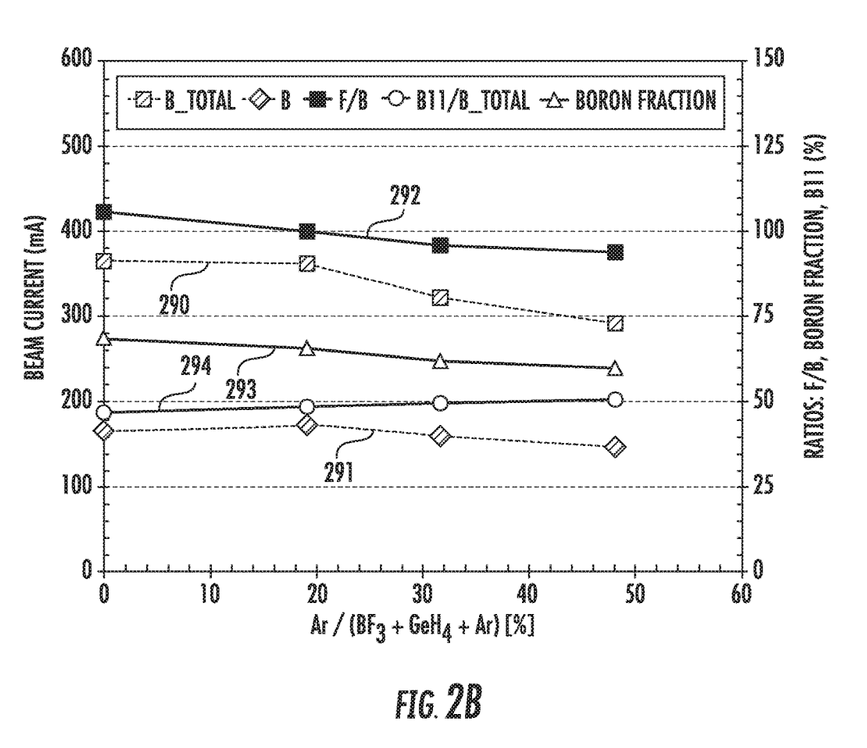
FIG. 2B is a second graph of ion beam current as a function of argon gas concentration.

Surprisingly, the introduction of argon in very large percentages, such as up to about 50%, still results in improvements in many of the ion beam metrics. FIG. 2B shows many of these metrics represented in a different format. Specifically, the total beam current of boron-containing ions is shown in line 290. Note that the total boron-containing beam current remains above about 290 mA, even as the amount of argon increases to about 47% of the total gas introduced into the chamber 105. However, there is a decrease in the total boron-containing beam current as the amount of argon exceeds about 20%. Interestingly, the beam current of pure boron-containing ions, shown in line 291, increases as the amount of argon introduced into the chamber 105 increases to about 20%. However, at larger percentages of argon, the beam current of pure-containing ions decreases slightly. In fact, the pure boron beam current is about 160 mA with no argon, and increases to about 172 mA when about 20% of the total gas is argon. The pure boron beam current then decreases to about 145 mA as the argon percentage continues to increase. The F/B ratio is shown as line 292, which is identical to line 220 in FIG. 2A. As described above, the F/B ratio decreases as the amount of argon increases throughout the range. Similarly, the boron fraction is shown as line 293, is identical to line 200 in FIG. 2A. Finally, the boron purity fraction is shown in line 294 and is identical to line 410 in FIG. 2A. FIG. 2B shows that, as the percentage of argon introduced into the chamber 105 increases, the total beam current of the boron-containing ions (line 290) decreases as the percentage of argon exceeds about 20%. The beam current of pure boron (line 291) also decreases as the percentage of argon exceeds about 20%. However, the boron purity fraction (line 294) increases throughout this entire range. Additionally, the ratio of fluorine ions to boron ions (the F/B ratio shown as line 292) decreases throughout this range. Finally, while there is a steady decrease in the boron fraction (line 293), the percentage of ions that contain boron remains above about 60% throughout the entire range.

Other noble gasses may also be used. For example, rather than using argon, neon may be used as the third gas.

Figure 4A:
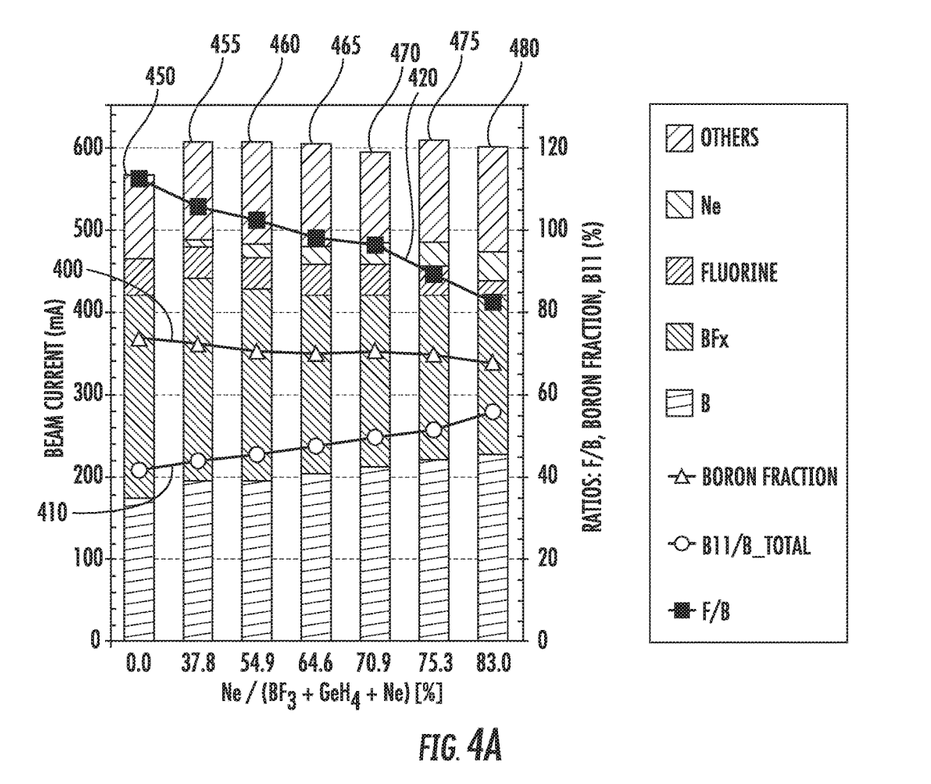
FIG. 4A is a representative graph of the ion current as a function of neon gas concentration.
Figure 4B:
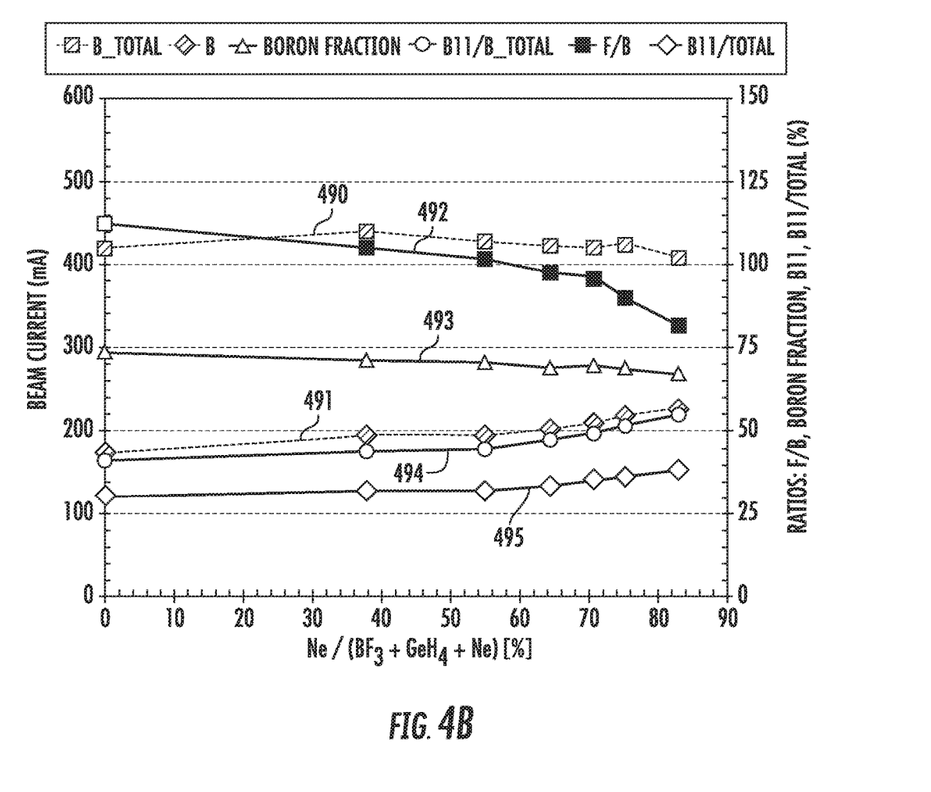
FIG. 4B is a second graph of the ion current as a function of neon gas concentration.

FIGS. 4A-4B show a plurality of bar graphs that show the ion species produced by an ion source using $BF_3$ as the first source gas and $GeH_4$ as the second source gas, with a varying amount of neon, which serves as the third source gas in this embodiment. Like argon, the introduction of neon as the third gas has positive benefits on ion beam composition and other metrics. However, surprising, the amount of neon which may be introduced while still achieving these benefits is much greater than for argon. In fact, as shown in more detail below, positive benefits are achieved even when over 80% of the total gas introduced to chamber 105 is neon!

In each of these bar graphs, the RF power was 8 kW, and the combined flow rate of the $BF_3$ and $GeH_4$ was 18 sccm. Additionally, the ratio of $BF_3$ to $GeH_4$ was held constant at 9:1.

As described above, in each of the bar graphs, it can be seen that the ion source 100 ionizes the $BF_3$ to form boron ions (i.e. $B^+$), as well as $BF_x^+$ ions, where $BF_x$ includes BF, $BF_2$ and $BF_3$. Additionally, fluorine ions are created. Finally, a plurality of other ion species, which may be components of the second source gas or may be impurities, is also created.

Bar graph 450 shows the composition of an ion beam where no neon is introduced, also referred to as the baseline. As seen in line 400, in this configuration, nearly 75% of the ions in the ion beam are dopant-containing ions, where, in this example, the dopant is boron. As described above, this metric is referred to as the boron fraction, or the dopant fraction. However, many of the dopant-containing ions also contain fluoride, such as in the form of $BF^+$, $BF_2^+$ and $BF_3^+$. In fact, as shown in line 410, only about 41% of the dopant-containing ions are pure dopant (i.e. $B^+$. This ratio is referred to as the boron purity percentage, or the dopant purity percentage. In other embodiments, this ratio may be referred to as the processing species purity percentage. Lastly, while 75% of the ion beam contains boron, a very large percentage of the ions also contain fluorine. In fact, line 420 shows the ratio of fluorine ions to dopant ions that are extracted as part of ion beam 180. The fluorine ions used in this ratio are a measure of all of the fluorine ions that are extracted. In other words, this includes pure fluorine ions ($F_x^+$), as well as ions that include other species, such as $BF_x^+$. Each fluorine ion is individually counted; thus, for example, $BF_2^+$ is counted as two fluorine ions. The number of dopant ions is calculated in the same way. Line 420 shows that there are actually more fluorine ions than boron ions. This metric is referred to as the F/B ratio.

Bar graph 455 shows the composition of an ion beam where approximately 37.8% of the total gas introduced to the ion chamber is the third source gas, which may be neon in this embodiment. While FIG. 4A shows data using at least 37.8%, it is noted that positive benefits are observed where the percentage of neon is as low as 20% Note that the total beam current of dopant-containing ions (i.e. $B^+$ and $BF_x^+$) has increased from about 420 mA when no neon is used, to about 440 mA. Additionally, there is a change in the composition of the ion beam. Specifically, as seen on line 400, the boron fraction has decreased slightly, mostly due to the additional neon ions that have been created. However, surprisingly, as shown in line 410, the percentage of pure dopant ions as compared to the total number of dopant-containing ions (the boron purity percentage or dopant purity percentage) has actually increased! In fact, the beam current of pure boron ions has also increased. Additionally, the ratio of fluorine ions to boron ions (i.e. the F/B ratio), as shown in line 420, has also decreased unexpectedly to about 105%. Additionally, the beam current of fluoride ions has decreased as well. In other words, the introduction of neon as a third source gas affected the composition of the resulting ion beam extracted from the plasma. Specifically, the introduction of neon has increased the formation of pure boron ions relative to the total number of boron-containing ions. Interestingly, the introduction of neon has also decreased the ratio of fluorine ions to boron ions. As stated above, in embodiments where mass analysis is not performed, these changes may improve the performance of the implanted workpiece.

Each of these trends continues as a greater percentage of neon is introduced. Bar graph 460 shows the composition of the ion beam where about 54.9% of all gas introduced into the chamber 105 comprises neon. At this concentration, the beam current of boron-containing ions begins to decrease slightly, from 440 mA to about 430 mA. However, the beam current of boron-containing ions is still greater than the baseline. The boron fraction, shown as line 400, has also decreased slightly due to the increased number of neon ions. However, other metrics have improved. Specifically, the boron purity percentage, shown in line 410, actually increased to nearly 50%. Additionally, the F/B ratio, shown in line 420, decreased to about 100%. Interestingly, the amount of other species, which includes all ions that are not boron-containing ions, fluorine ions or neon ions, actually decreases at this neon percentage. The beam current of fluorine ions also decreases to less than about 40 mA.

Bar graph 465 shows the composition of the ion beam where about 64.6% of all gas introduced into the chamber 105 comprises neon. At this concentration, the beam current of boron-containing ions again decreases slightly, from 430 mA to about 420 mA. However, the beam current of boron-containing ions is still greater than in the baseline. The boron fraction, shown in line 400, has also decreased slightly to about 70% due to the increased number of neon ions. However, other metrics have improved. Specifically, the boron purity percentage, shown in line 410, actually increased to about 48%. Additionally, the F/B ratio, shown in line 420, decreased to under 100%. Again, the beam current of the other species has decreased as well. The beam current of fluorine ions also remains relatively constant at about 20 mA.

Bar graph 470 shows the composition of the ion beam where about 70.9% of all gas introduced into the chamber 105 comprises neon. At this concentration, the beam current of boron-containing ions remains relatively constant at about 420 mA. However, the beam current of boron-containing ions remains greater than in the baseline. The boron fraction has also decreased slightly to about 70% due to the increased number of neon ions. However, other metrics have improved. Specifically, the boron purity percentage, shown in line 410, actually increased to over 50%. Additionally, the F/B ratio, shown in line 420, decreased to about 95%. Again, the beam current of the other species has decreased as well. The beam current of fluorine ions also remains relatively constant at about 20 mA.

Bar graph 475 shows the composition of the ion beam where about 75.3% of all gas introduced into the chamber 105 comprises neon. At this concentration, the beam current of boron-containing ions remains relatively constant at about 420 mA. The boron fraction, shown in line 400, has also decreased slightly to slightly under 70% due to the increased number of neon ions. However, other metrics have improved. Specifically, the boron purity percentage, shown in line 410, actually increased to about 52%. Additionally, the F/B ratio, shown in line 420, decreased to about 90%. Again, the beam current of the other species has decreased as well. The beam current of fluorine ions also decreased slightly to about 15 mA.

Bar graph 480 shows the composition of the ion beam where about 83.0% of all gas introduced into the chamber 105 comprises neon. At this concentration, the beam current of boron-containing ions decreases slightly to about 410 mA. The boron fraction, shown in line 400, has also decreased slightly to about 68% due to the increased number of neon ions. However, other metrics have improved. Specifically, the boron purity percentage, shown in line 410, actually increased to about 56%. Additionally, the F/B ratio, shown in line 420, decreased to about 80%. Again, the beam current of the other species has decreased as well. The beam current of fluorine ions also decreased slightly to about 15 mA. Surprisingly, even when 83% of the total gas is neon, the neon ion beam remains less than about 40 mA. This may be due to the high ionization energy of neon.

Surprisingly, the introduction of neon in very large percentages, such as between 20 and 90%, still results in improvements in many of the ion beam metrics. This is in contrast to argon, where the introduction of argon improved beam metrics up to a certain percentage, and then degraded those metrics. The fact that the amount of neon can be as great as 83% or more is an unexpected result. FIG. 4B shows many of these metrics represented in a different format. Specifically, the total beam current of boron-containing ions is shown in line 490. Note that the total boron-containing beam current remains above 400 mA, even as the amount of neon increases to about 83% of the total gas introduced into the chamber 105. Interestingly, the beam current of pure boron-containing ions, shown in line 491, increases as the amount of neon introduced into the chamber 105 increases. In fact, the pure boron beam current is about 175 mA at the baseline, which is when no neon is used, and increases to about 230 mA when 83% of the total gas is neon. More specifically, when 37.8% neon is introduced, the pure boron beam current increases more than 10% relative to the baseline. At the baseline, the pure boron beam current is about 175 mA. This increases to about 195 mA when 37.8% neon is introduced. This trend continues with increasing amounts of neon. For example, there is a 15% increase in pure boron beam current, relative to the baseline, when 64.6% neon is introduced. This increase is 20% or more for increased levels of neon. The F/B ratio is shown as line 492, which is identical to line 420 in FIG. 4A. As described above, the F/B ratio decreases as the amount of neon increases throughout the range. Specifically, the F/B ratio is 112.6% at the baseline, when no neon is used. That F/B ratio drops more than 6% to 105.7% with the introduction of 37.8% neon. As the amount of neon increases, the F/B ratio continues to drop. For example, at 54.9% neon, the F/B ratio is nearly 10% lower as compared to the baseline. At 75.3% neon, the F/B ratio drops more than 20% relative to the baseline. Similarly, the boron fraction is shown as line 493, is identical to line 400 in FIG. 4A. Finally, the boron purity fraction is shown in line 494 and is identical to line 410 in FIG. 4A. This boron purity fraction, which represents the ratio of pure processing species ions to total processing species ions, increases by more than 6% when 37.8% neon is introduced, as compared to the baseline. At 54.9% neon, the boron purity fraction increases nearly 10% relative to the baseline. In fact, at high levels of neon dilution, the improvement in boron purity fraction relative to the baseline is more than 20%! Additionally, the number of pure dopant ions, or pure processing species ions, as a percentage of the total ions, referred to as pure dopant ratio, also increases as neon is introduced in greater quantities. This pure dopant ratio is shown in line 495. For example, at the baseline, about 31% of all of the ions are pure dopant ions. However, at 37.8% neon, that pure dopant ratio increases by about 4% to 32.2%. At higher levels of neon, the percentage of pure dopant ions may increase by 10% or more, relative to the baseline. FIG. 4B shows that, as the percentage of neon introduced into the chamber 105 increases, the total beam current of the boron-containing ions (line 490) remains roughly constant. However, metrics, such as the beam current of pure boron (line 491), the boron purity fraction (line 494), and the pure dopant ratio (line 495) all improve throughout this entire range. Additionally, the ratio of fluorine ions to boron ions (the F/B ratio shown as line 492) decreases throughout this range, with a large decrease as the percentage of neon exceeds about 60%. Finally, while there is a steady decrease in the boron fraction (line 493), the percentage of ions that contain boron remains above 70% throughout the entire range.

These unexpected results, shown in FIGS. 2A-2B and 4A-4B, have many benefits.

First, heavier dopant-containing ions, such as $BF^+$, $BF_2^+$ and $BF_3^+$ tend to be implanted at a more shallow depth than pure dopant ions, such as $B^+$. During the subsequent thermal treatment, these shallowly implanted ions are more likely to diffuse out of the workpiece. In other words, the total beam current of all dopant-containing ions may not be indicative of the amount of dopant that is actually implanted and retained in the workpiece. Without wishing to be bound to any particular theory, it is believed that the argon and neon metastables in the plasma may break down the larger dopant-containing ions into more desirable pure dopant ions.

Secondly, the implanting of fluorine, in any form, may be deleterious effects. The implanting of fluorine ions may cause defects in the workpiece, which affects its performance. The implanted fluorine may also cause the dopants to diffuse out from the workpiece. Fluorine is also known to retard the dopant diffusion into the workpiece, making the annealed dopant profile shallow, which is not preferable for solar cell applications.

Third, the introduction of argon and/or neon has a limiting effect on the generation of other species, also referred to as contaminants, that are generated. Without wishing to be bound to any particular theory, it is believed that these gasses stabilize the plasma, resulting in a reduction in chamber wall sputtering. Due to its large ionization cross-section, argon and neon are relatively easy to ionize and stabilize the discharge. Because of this, the plasma is maintained at relatively low plasma potential, so that ion sputtering from the wall material can be reduced.

Fourth, during the implanting of the workpiece, the argon and/or neon ions may sputter on the surface deposition layer of the workpiece. This may serve to remove any materials that are deposited during the implant process. Some of these materials may be difficult to remove via a wet chemistry process after the implant.

Fifth, in the case of neon, high ionization energy implies that few neon ions are created. Further, these ions have a relatively low mass and therefore cause minimal damage to the workpiece. Thus, neon may be used to improve the beam composition, without having few adverse effects.

Thus, an ion beam having reduced beam impurity and increased dopant purity can be created by using three source gasses. The first source gas, or feedgas, may be a species that contains both a dopant and fluorine, such as $BF_3$ or $B_2F_4$. The second source gas may be a species that contains hydrogen and either silicon or germanium, such as silane ($SiH_4$) or germane ($GeH_4$). The third source gas may be argon, neon or another noble gas. These three source gasses are introduced into a chamber 105 of an ion source 100, either simultaneously or sequentially, where they are ionized. The ion source may use RF energy generated by RF antenna 120. In another embodiment, the ion source may utilize the thermionic emission of electrons using an IHC. Other methods of ionizing a gas may also be used by the ion source. Ions from all three source gasses are directed toward a workpiece 160, where they are implanted into the workpiece 160. As described earlier, these ions may not be mass analyzed, meaning that all extracted ions are implanted into the workpiece 160.

In another example, the second source gas may include a dopant having the opposite conductivity. For example, the first source gas, or feedgas, may be a species than contains both boron and fluorine, such as $BF_3$ or $B_2F_4$. The second source gas may be a species that contains hydrogen and a Group V element, such as phosphorus, nitrogen or arsenic.

While FIGS. 2A-2B and 4A-4B shows the results when boron is used as the dopant in the first source gas, the disclosure is not limited to this embodiment. Other dopants, such as gallium, phosphorus, arsenic or other Group 3 and Group 5 elements, may be used.

The above disclosure discusses that the third source gas may be introduced in amounts ranging from about 19% to about 48% for argon and from about 20% to 90% for neon. However, the disclosure is not limited to this range. In some embodiments, the third source gas may be introduced in amounts ranging from about 15% to about 90%. In other embodiments where the third source gas is argon, the third source gas may be introduced in amounts ranging from about 15% to about 40%. In other embodiments where the third source gas is argon, the third source gas may be introduced in amounts ranging from about 15% to about 50%. In certain embodiments where the third source gas is neon, the third source gas may be introduced in amounts ranging from about 20% to about 90%. In certain embodiments where the third source gas is neon, the third source gas may be introduced in amounts ranging from about 25% to 60%. In certain embodiments, where the third source gas is neon, the third source gas may be introduced in amount greater than 40%, such as between 40% and 90%. Additionally, the ratio of the first source gas to the second source gas may be about 9:1, although other ratios may also be used. The combined flow rate of the first source gas and the second source gas may be between 10 and 20 sccm.

While the above description discloses the use of three source gasses, in other embodiments, two source gasses may be used. For example, in some embodiments, as described above, the first source gas may be in the form of $DF_n$ or $D_mF_n$, where D represents the dopant (or processing species) atom, which may be boron, gallium, phosphorus, arsenic or another Group 3 or Group 5 element. In certain embodiments, the second source gas is not used. Instead, only the first source gas and the third source gas are combined in the ion source 100. In this embodiment, the flow rate of the first source gas may be between 10 and 30 sccm. In one embodiment where the third gas is argon, the third source gas may constitute between 15% and 40% of the total gas introduced to the chamber 105. In some embodiments where the third gas is argon, the third source gas may be introduced in amounts ranging from about 15% to about 30%. In other embodiments where the third gas is argon, the third source gas may be introduced in amounts ranging from about 15% to about 40%. In other embodiments where the third gas is argon, the third source gas may be introduced in amounts ranging from about 15% to about 50%. In certain embodiments where the third gas is neon, the third gas may be introduced in amounts ranging from about 20% to about 90%. In certain embodiments where the third source gas is neon, the third source gas may be introduced in amounts ranging from about 25% to 60%. In certain embodiments, where the third source gas is neon, the third source gas may be introduced in amount greater than 40%, such as between 40% and 90%.

As described above, the introduction of a third gas, such as argon or neon, with the $BF_x$ gas may affect the composition of the resulting ion beam. Specifically, the boron purity percentage may be increased, while the F/B ratio may decrease. In other words, the change in the composition of the ion beam may occur without the use of the second source gas.

Figure 3:
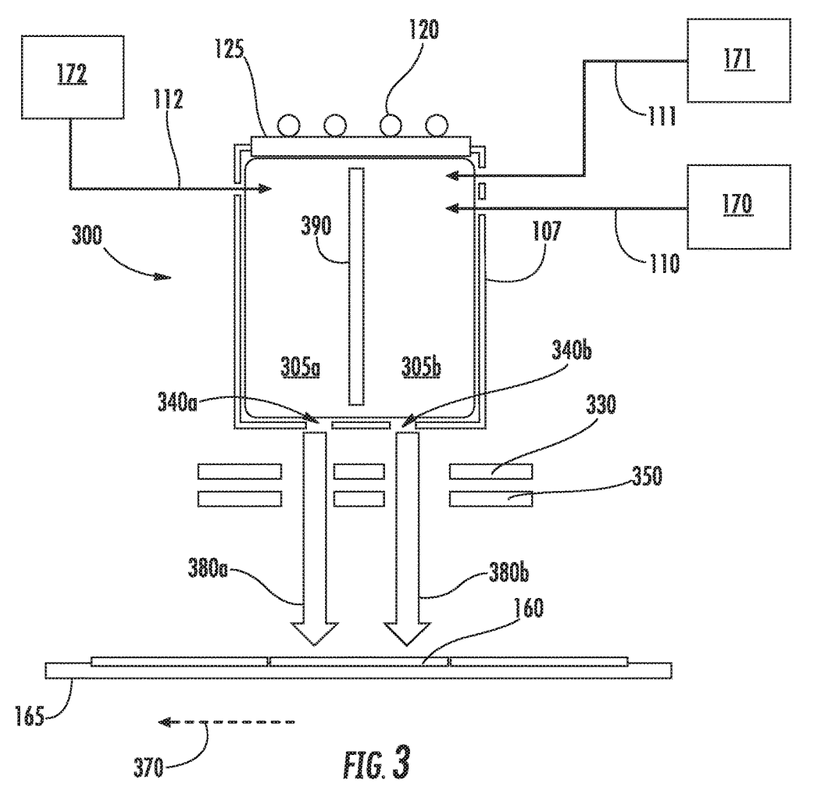
FIG. 3 shows an implant system according to another embodiment.

FIG. 3 shows another embodiment. In this embodiment, the ion source 300 has a chamber separator 390 disposed within the chamber, effectively separating the chamber into a first sub-chamber 305a and a second sub-chamber 305b. Each of first sub-chamber 305a and second sub-chamber 305b has a respective aperture 340a, 340b. Additionally, the ground electrode 350 and extraction suppression electrode 330 may be modified to have two openings, corresponding to apertures 340a, 340b. As before, the chamber has a dielectric window 125 and an RF antenna 120 disposed thereon. In this embodiment, the first source gas is stored in first source gas container 170 and is introduced to the second sub-chamber 305b through the gas inlet 110. The first source gas may be any of the species described above. The second source gas is stored in the second source gas container 171 and is introduced to the second sub-chamber 305b through the second gas inlet 111. The second source gas may be any of the species described above. As described with respect to FIG. 1B, in some embodiments, the first source gas container 170 and the second source gas container 171 may be connected to a single gas inlet. In another embodiment, illustrated in FIG. 1C, the first and second source gasses may be mixed in a single source gas container. Additionally, in some embodiments, the second source gas is not used, as described above. As described above, the ratio of the first source gas to the second source gas may be about 9:1, although other ratios may be used. The combined flow rate may be between 10 and 20 sccm. Argon may be stored in third source gas container 172 and introduced to the first sub-chamber 305a through the third gas inlet 112.

In this embodiment, an argon ion beam 380a is extracted through aperture 340a. Concurrently, a dopant ion beam 380b is extracted through aperture 340b. This dopant ion beam 380b contains boron-containing ions, as well as fluorine ions, and other ion species.

In FIG. 3, the argon ion beam 380a and the dopant ion beam 380b are parallel to one another so that they strike the workpiece 160 at different locations. In this embodiment, the workpiece is scanned in the direction indicated by arrow 370. In this way, each location on the workpiece 160 is first implanted by dopant ion beam 380b, and then struck by argon ion beam 380a. As described above, the argon ion beam 380a may serve to sputter deposition layer material from the surface of the workpiece 160, which was deposited during the implant of dopant ion beam 380b.

As explained above, the argon implant may remove material from the surface deposition layer, which is difficult to remove using wet chemistry.

In another embodiment, the argon ion beam 380a and the dopant ion beam 380b are directed or focused so that they simultaneously strike a location on the workpiece 160. In this embodiment, the workpiece 160 can be scanned in any direction.

In yet another embodiment, the two implants may be sequentially, such that the entire workpiece 160 is implanted by the dopant ion beam 380b. At a later time, an argon ion beam 380a is directed toward the workpiece 160.

In each of the embodiments described herein and associated with FIG. 3, the implants may be performed without mass analysis, such that all of the extracted ions strike the workpiece.

While the embodiment of FIG. 3 was described using argon, it is possible that other gasses, such as neon, may be substituted for argon to achieve the same effect.

Furthermore, although the embodiments disclosed herein describe the use of argon and neon as the third source gas, the disclosure is not limited to this embodiment. As stated above, other noble gasses, such as helium, krypton and xenon, may also be used as the third source gas. Alternatively, a combination of noble gasses may serve as the third source gas.

Additionally, the embodiments disclosed herein describe an implant process where a processing species, such as a dopant, is implanted into the workpiece 160. However, the disclosure is not limited to this embodiment. For example, other processes may be performed on a workpiece using the combinations of source gasses described herein. For example, deposition or etching processes may also be performed on the workpiece using the disclosed combination of source gasses.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting a workpiece, comprising:
energizing a first source gas, comprising a processing species and fluorine, a second source gas, comprising hydrogen and at least one of silicon and germanium, and neon in a chamber to form a plasma in the chamber, where the processing species is boron; and
accelerating ions from the plasma toward the workpiece and implanting the ions in the workpiece, wherein the workpiece is disposed in the chamber, wherein an amount of neon, by volume, introduced in the chamber is selected so that a number of pure processing species ions extracted from the plasma and implanted in the workpiece as a percentage of all processing species-containing ions increases by at least 5%, as compared to a baseline when neon is not used.

2. The method of claim 1, wherein the number of pure processing species ions extracted from the plasma and implanted in the workpiece as the percentage of all processing species-containing ions increases by at least 10%, as compared to the baseline.

3. The method of claim 1, wherein a ratio of the number of fluorine ions to a number of processing species ions extracted from the plasma and implanted in the workpiece is decreased by at least 5%, as compared to the baseline.

4. The method of claim 1, wherein a beam current of the pure processing species ions being implanted into the workpiece increases by at least 10%, as compared to the baseline.

5. The method of claim 1, wherein the neon comprises between 20-90%, by volume, of the total gas introduced into the chamber.

6. The method of claim 5, wherein the neon comprises between 25-50%, by volume, of the total gas introduced into the chamber.

7. The method of claim 1, wherein the first source gas comprises $BF_3$.

8. The method of claim 1, wherein the first source gas comprises $B_2F_4$.

9. A method of implanting dopant into a workpiece, comprising:
energizing a first source gas, comprising boron and fluorine, a second source gas, comprising hydrogen and at least one of germanium and silicon, and neon in a chamber to form a plasma in the chamber; and
accelerating ions from the plasma toward the workpiece and implanting the ions in the workpiece, wherein the workpiece is disposed in the chamber,
wherein between 20% and 90% of a total volume of gas introduced into the chamber comprises neon and wherein an amount of the neon is such that a beam current of pure boron-containing ions being implanted into the workpiece is at least 10% greater as compared to a baseline where the neon is not used.

10. The method of claim 9, wherein between 25% and 50% of the total volume of gas introduced comprises the neon.

11. The method of claim 9, wherein a ratio of a volume of the first source gas introduced to the chamber to a volume of the second source gas introduced to the chamber is 9:1.

* * * * *